United States Patent [19]

Hong

[11] Patent Number: 5,449,632

[45] Date of Patent: Sep. 12, 1995

[54] MASK ROM PROCESS WITH SELF-ALIGNED ROM CODE IMPLANT

[75] Inventor: Gary Hong, Hsin-chu, Taiwan

[73] Assignee: United Microelectronics Corporation, Hsinchu, Taiwan

[21] Appl. No.: 289,629

[22] Filed: Aug. 12, 1994

[51] Int. Cl.$^6$ ............................................. H01L 21/265
[52] U.S. Cl. ......................................... 437/48; 437/45; 437/52
[58] Field of Search ....................... 437/52, 45, 48, 60, 437/47; 257/390-391

[56] References Cited

U.S. PATENT DOCUMENTS 5,278,078  1/1994  Kanebako et al. ................. 437/29
5,378,649  1/1995  Huang ............................... 437/52

Primary Examiner—Olik Chaudhuri
Assistant Examiner—H. Jey Tsai
Attorney, Agent, or Firm—George O. Saile; Graham S. Jones II

[57] ABSTRACT

A ROM semiconductor device and a method of manufacturing that device on a semiconductor substrate comprises the steps of forming a blanket word line layer over the device with a reverse word line mask over the word line layer, the word line mask comprising a parallel array of mask strips, forming a ROM code mask over the reverse word line mask, the ROM code mask having a ROM code opening centered between a pair of the mask strips. A code implant dopant is ion implanted through the ROM code opening down into a doped region in the substrate below the ROM code opening. The ROM code mask is removed. A word line mask is formed comprising complementary mask strips between the mask strips of the reverse word line mask followed by removal of the reverse word line mask, etching the word line layer to form a parallel array of word lines beneath the complementary mask strips, and forming a blanket layer of dielectric material over the device.

13 Claims, 8 Drawing Sheets

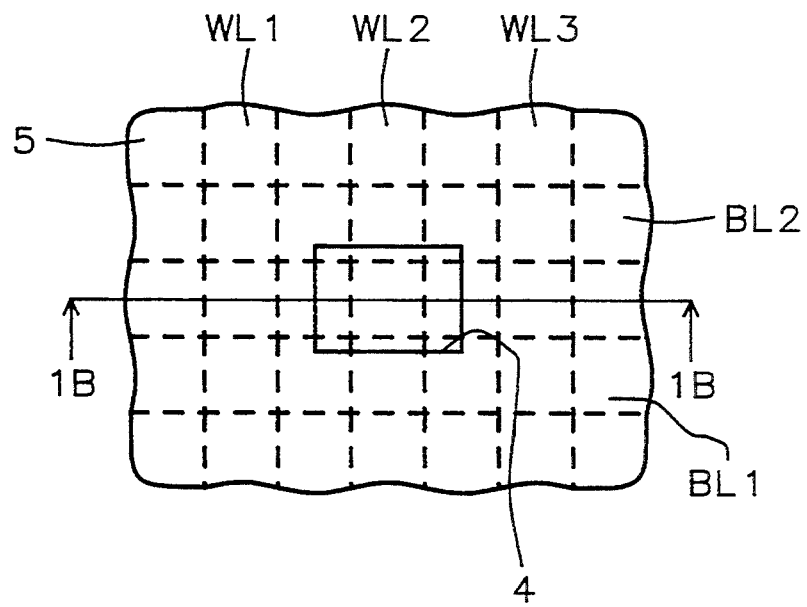
*FIG. 1A – Prior Art*
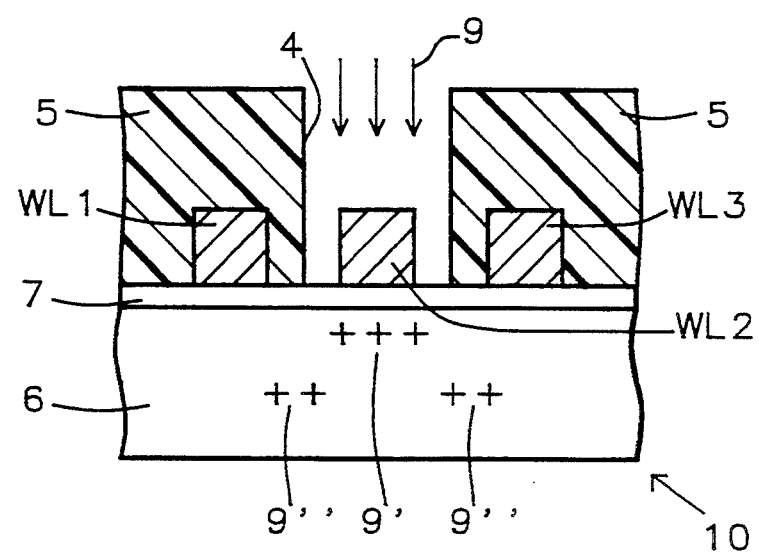
*FIG. 1B – Prior Art*

MASK ROM PROCESS WITH SELF-ALIGNED ROM CODE IMPLANT

BACKGROUND OF THE INVENTION

1. Field of the Invention

This invention relates to semiconductor memory devices and more particularly to an improved ROM code region.

2. Description of Related Art

FIG. 1A shows a schematic plan view of a prior art ROM device 10. FIG. 1B shows a cross section taken along line 1B—1B in FIG. 1 of the prior art device 10 including a semiconductor substrate 11 coated with a gate oxide layer 7. Referring to FIG. 1A, device 10 includes an array of buried bit lines BL1 and BL2 and with an array of word lines WL1, WL2, and WL3 passing over the tops of the bit lines BL1 and BL2. Referring to FIGS. 1A and 1B, a ROM code implant region 9' is located below an opening 4 in the photoresist mask 5 at the intersection of word line WL2 and the space between bit lines BL1 and BL2.

Upon gate oxide layer 7 is an array of word lines represented by lines WL1, WL2, and WL3 and photoresist mask 5 formed above the word lines WL1, WL2, and WL3 in the process of manufacture during an early stage in which a layer of photoresist 5 has been formed over the device 10 with an opening 4 above the ROM. The section in FIG. 1B shows code implantation 9' of implanted boron ions 9. The section line 1B—1B is taken between the two bit lines BL1 and BL2. The problem with that prior art process is the side diffusion 9" of boron causing lower cell current in "on-cells" adjacent to the implanted cell region 9'.

SUMMARY OF THE INVENTION

In accordance with this invention a method of manufacturing a ROM semiconductor device on a semiconductor substrate with an array of parallel bit lines integral therewith is provided. The bit lines are oriented in a first direction, which comprises the steps of forming a blanket word line layer over the device, forming a reverse word line mask over the word line layer, the word line mask comprising a parallel array of mask strips, forming a ROM code mask over the reverse word line mask, the ROM code mask having a ROM code opening therethrough, the opening being centered between a pair of the mask strips, ion implanting a code implant dopant through the ROM code opening down into a doped region in the substrate below the ROM code opening, removing the ROM code mask, forming a word line mask comprising complementary mask strips between the mask strips of the reverse word line mask, removing the reverse word line mask, etching the word line layer to form a parallel array of word lines beneath the complementary mask strips, and forming a blanket layer of dielectric material over the device.

Preferably, the reverse word line mask comprises silicon nitride; the reverse word line mask has a thickness within the range from about 2,000 Å to about 4,000 Å; the word line mask comprises a layer of silicon dioxide having a thickness of about 1,000 Å; the word line mask comprises a layer of silicon dioxide formed by thermal oxidation at a temperature of about 850° C. in wet oxygen gas for about 20 minutes; before forming the ROM code mask, forming dielectric spacers on the side-walls of the reverse word line mask over the word line layer whereby the window of the for the ROM code implant is narrowed; the code implant dopant comprises boron implanted with a dose of about $1 \times 10^{14}/cm^2$ within a range of energy levels from about 100 keV to about 200 keV;

In accordance with another aspect of this invention, a semiconductor device formed on a lightly doped silicon semiconductor substrate with an array of parallel bit lines integral therewith, the bit lines being oriented in a first direction, comprising a word line array formed on the device oriented orthogonally relative to the array of bit lines, a word line mask layer comprising complementary mask strips over the word line, an ion implanted code implant of a dopant in a doped region in the substrate, and a blanket layer of dielectric material over the device.

Preferably, the word line mask comprises a layer of silicon dioxide having a thickness of about 1,000 Å; with dielectric spacers over the word line layer; the word line mask comprises a layer of silicon dioxide formed by thermal oxidation at a temperature of about 850° C. in wet oxygen gas for about 20 minutes; and the code implant dopant comprises boron implanted with a dose of about $1 \times 10^{14}/cm^2$ within a range of energy levels from about 100 keV to about 200 keV.

BRIEF DESCRIPTION OF THE DRAWINGS

The foregoing and other aspects and advantages of this invention are explained and described below with reference to the accompanying drawings, in which:

FIGS. 1A shows a schematic plan view of a prior art ROM device.

FIG. 1B shows a cross section taken along line 1B—1B in FIG. 1 of the prior art device

DESCRIPTION OF THE PREFERRED EMBODIMENT

Figure 2:
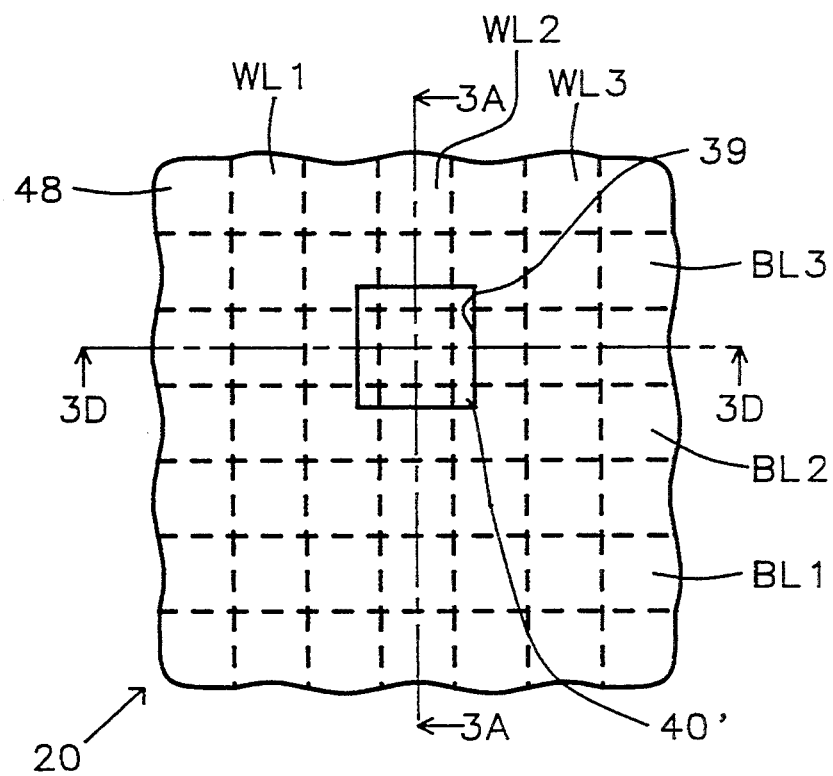
FIG. 2 shows a schematic plan view of a ROM device in accordance with this invention.

FIG. 2 shows a schematic plan view of a ROM device 20 in accordance with this invention. Device 20 includes an array of buried bit lines BL1, BL2, and BL3 and an orthogonally oriented array of word lines WL1, WL2, and WL3 lines passing over the tops of the bit lines BL1, BL2, and BL3, substantially at right angles thereto. A ROM code implant 40' made into opening 39 is located in the device substrate under a particular word line WL2 at its intersection with bit lines BL2 and BL3. The word lines WL1, WL2, and WL3 are covered by silicon dioxide "poly oxide" layer 42 in FIG. 3I-3K plus a blanket dielectric layer 48 as shown in FIGS. 3J. Alternatively the word lines WL1, WL2, and WL3 are covered by silicon dioxide "poly oxide" layer 42 in FIGS. 4C–4G plus silicon dioxide spacers 50 a blanket dielectric layer 48 as shown in FIG. 4G.

FIGS. 3A–3J show a first process flow of forming the device of FIG. 2.

Figure 3A:
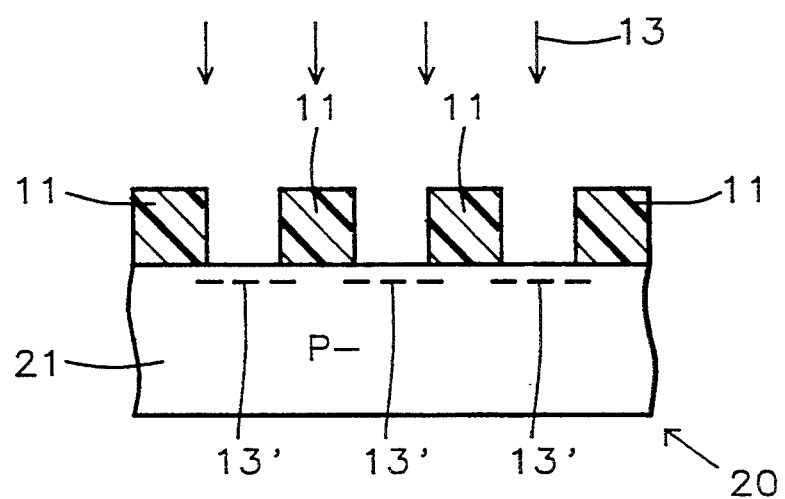
FIGS. 3A–3J show a first process flow for forming the device of FIG. 2.

FIG. 3A is a cross sectional view taken along line 3A—3A in FIG. 2 showing the device 20 in an early stage of manufacture with the P− substrate 21 covered with a conventional bit line photoresist mask 11, which is being exposed to conventional ion implantation of arsenic ions 13 to provide an array of N+ implanted regions 13' in P− substrate 21.

Figure 3B:
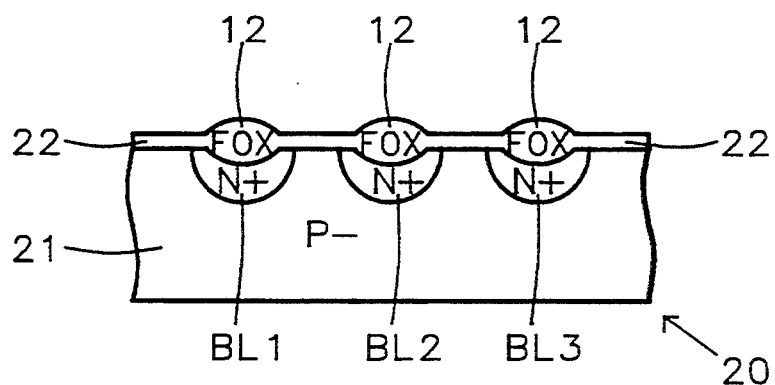

FIG. 3B shows the device 20 of FIG. 3A after the photoresist mask 11 has been stripped by a well known conventional technique.

The surface of device 20 is then oxidized to form gate oxide layer 22 and FOX (field oxide) regions 12. The gate layer 22 and FOX regions 12 are formed in a blanket oxidation process preferably employing dry oxidation at 900° C. or a well-known conventional method to provide gate oxide layer 22 over the P-substrate 21, and (FOX) regions 12 over the N+ implanted regions 13'. The gate oxide layer 22 has a thickness within the range from about 100 Å to about 200 Å. The FOX regions 12 have a thickness within the range from about 300 Å to about 1,000 Å.

In addition, below the FOX regions 12 a parallel array of several conventional buried bit lines BL1, BL2, and BL3 are formed by a conventional process from the N+ implanted regions 13' in the P− doped silicon substrate 21.

Figure 3C:
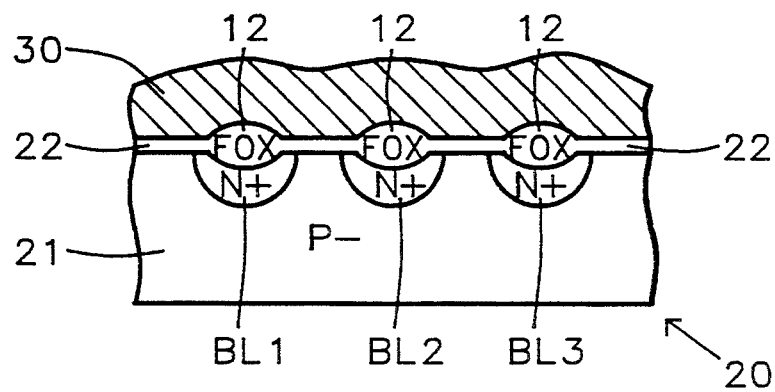

Referring to FIG. 3C the device of FIG. 3B is shown after the gate oxide layer 22 and FOX regions 12 are coated with a blanket layer 30 to be patterned into a word lines WL1, WL2, and WL3 from blanket layer 30. Blanket layer 30 is composed of polycrystalline silicon containing (polysilicon 1 or polycide 1) with a thickness within the range of about 3,000 Å. The polysilicon 1 or polycide 1 word line layer 30 is formed using a conventional method, e.g. LPCVD.

Figure 3D:
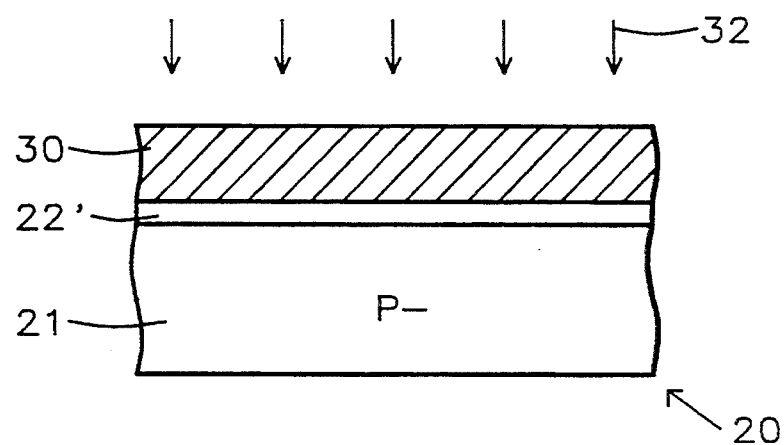

FIG. 3D shows the device of FIG. 3C with a section taken along line 3D—3D in FIG. 2. The view seen in FIG. 3D is oriented at right angles to the view in FIG. 3C. The section line 3D—3D is taken midway between bit lines BL2 and BL3 so that the bit lines BL1, BL2 and BL3 of FIG. 3C are not seen in FIG. 3D for convenience of illustration.

FIG. 3D also shows the conventional process of ion implantation of dopant ions 32 into the word line layer 30.

Figure 3E:
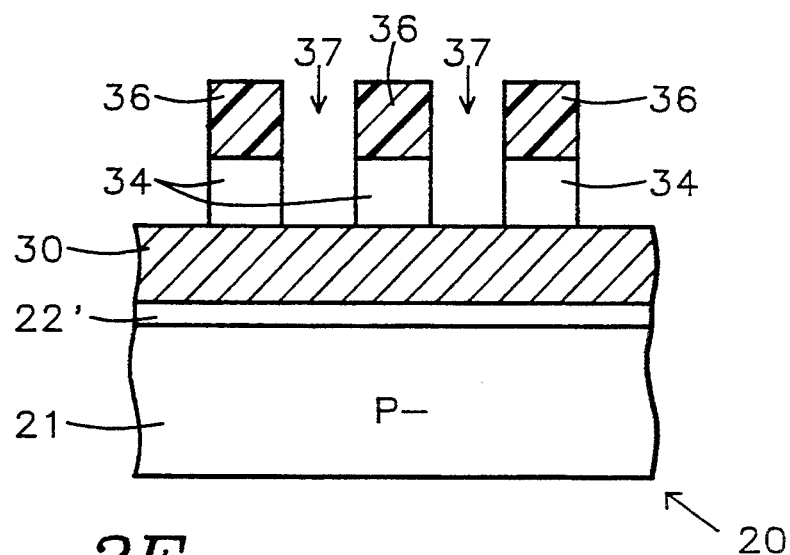

FIG. 3E shows the device of FIG. 3D after a blanket silicon nitride ($Si_3N_4$) layer 34 has been formed over the word line layer 30. Silicon nitride ($Si_3N_4$) layer 34 is deposited to a thickness within a range from about 2,000 Å to about 4,000 Å. The silicon nitride ($Si_3N_4$) layer 34 is chemically deposited by reacting silane and ammonia in an APCVD process at atmospheric pressure at temperatures between 700° C. and 900° C. or by reacting dichlorosilane and ammonia at a reduced pressure LPCVD process at temperatures between 700° C. and 800° C.

Next as also shown by FIG. 3E, the silicon nitride ($Si_3N_4$) layer 34 on the device 20 is covered with a blanket photoresist layer 36 which was then patterned with horizontal stripes of silicon nitride layer 34 leaving horizontal trenches 37 in a photoresist mask 36. (Note that the mask 36 is the reverse of the pattern of the word lines to be etched later as shown in FIG. 3J so it will be referred to hereinafter as a reverse mask.) Reverse mask 36 has been used during patterning of layer 34 to form a reverse word line mask pattern in the silicon nitride layer 34. Then, using the photoresist mask layer 36, the silicon nitride layer 34 is patterned, preferably by etching, extending down to word line layer 30 which serves as an etch stop.

Figure 3F:
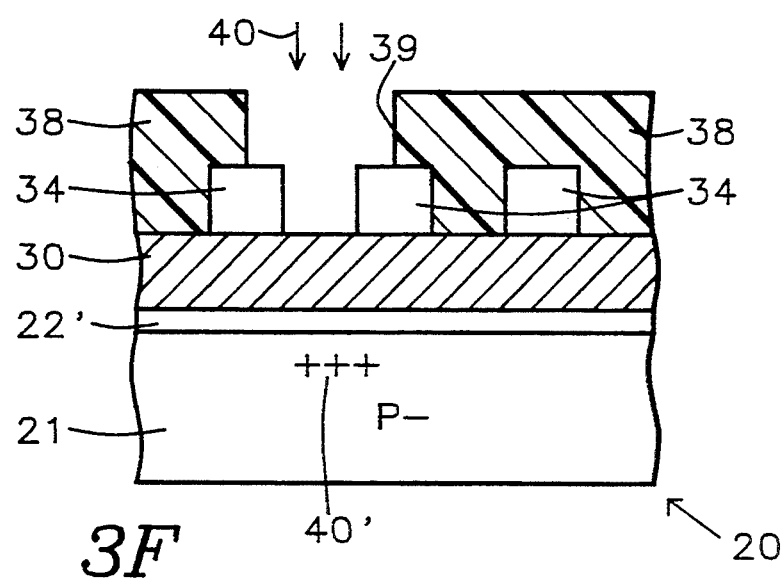

FIG. 3F shows the product of FIG. 3E after the photoresist mask 36 is stripped by a conventional process.

Next, as shown in FIG. 3F, a blanket coating of another photoresist layer 38 has been applied to the device 20, which layer 38 has been patterned by conventional photolithographic exposure followed by development forming a mask with an opening 39. The proper exposure conditions (intensity, time) are chosen such that the area of photoresist 38 above the word line layer 30 can be developed as shown in FIG. 3F. A ROM code mask pattern is exposed to the photoresist layer 38 forming a code implant opening 39 therethrough as shown above silicon nitride mask 34 and word line layer 30. A code ion implant of boron B+ ions 40 is performed by passing ions through the opening 39 down through word line layer 30 and gate oxide layer 22' into the P-substrate 21 in a region 40' which is self-aligned with the word line pattern in silicon nitride reverse mask layer 34. The chemical species of the dopant implanted is boron with a dose of $1 \times 10^{14}/cm^2$ within a range of energy from about 100 keV to about 200 keV.

Figure 3G:
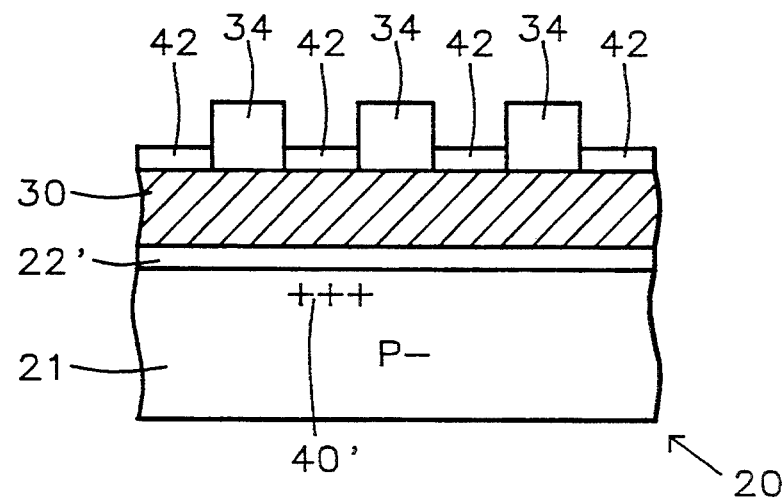

FIG. 3G shows the device of FIG. 3F after thermal oxidation of the exposed surface of polysilicon 2 or polycide 2 layer 30 in a wet $O_2$ atmosphere at about 850° C. for about 20 minutes forming a silicon dioxide "poly oxide" polycrystalline silicon thermal oxide layer 42 having a thickness of about 1000 Å in stripes between the stripes of silicon nitride layer 34. The silicon dioxide layer 42 will form the positive mask for the word line layer 30 as shown in FIG. 3I and FIG. 3J.

Figure 3H:
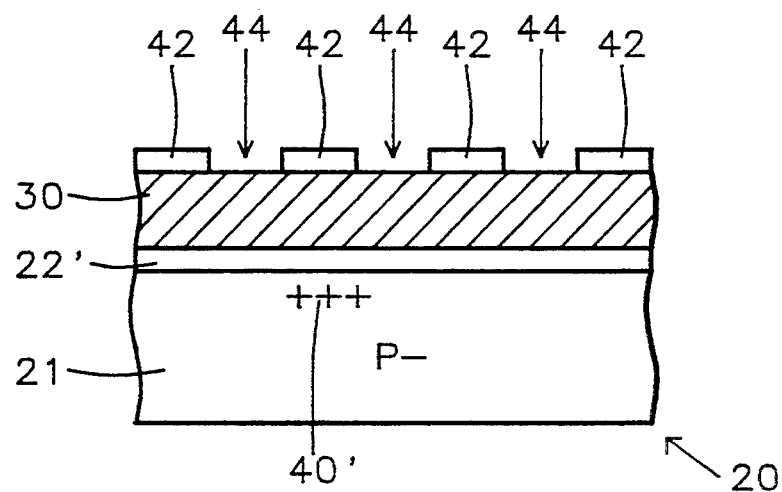

FIG. 3H shows the device after the $Si_3N_4$ silicon nitride reverse mask 34 has been removed by a wet etch leaving the silicon dioxide layer 42 positive mask.

Figure 3I:
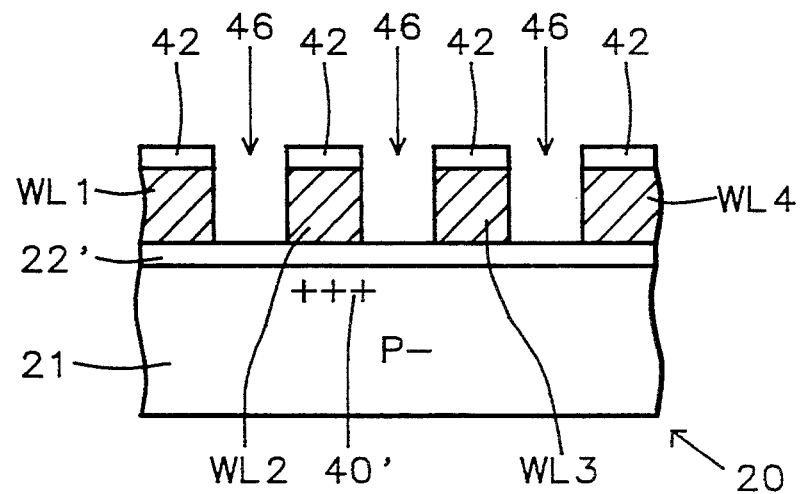
Figure 3J:
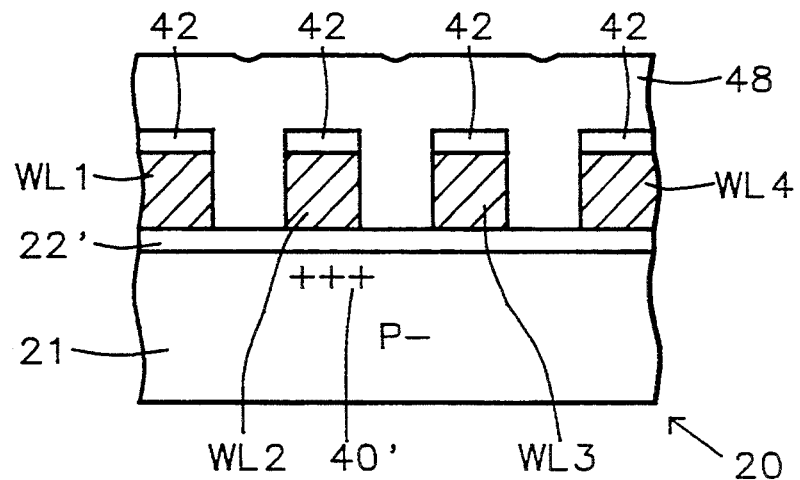

FIG. 3I shows the device of 3H after the word line layer 30 has been etched down to gate oxide 22' using the polycrystalline silicon thermal oxide layer 42 positive mask to pattern that etching process. As described above, layer 30 is preferably composed of polycrystalline silicon containing (polysilicon 2 or polycide 2) with a thickness of about 3,000 Å. Such a polysilicon 2 layer is etched by a conventional etchant.

Next, FIG. 3J shows the device of FIG. 3I after the silicon dioxide "poly oxide" layer 42 and the exposed gate oxide 22' are covered by a blanket dielectric layer 48 preferably composed of glass over the device 20. The glass layer 48 is preferably composed of BPSG which has been formed with a thickness of from about 5,000 Å to about 9,000 Å and with a composition of boron (B) about 4.0% and phosphorous (P) about 4.0%. The process used to deposit the BPSG layer 48 can be performed in an instrument selected from APCVD, PECVD, LPCVD (Low Pressure C.V.D.) which deposits BPSG, BPTEOS, TEOS, etc.

A suitable alternative to BPSG is BPTEOS. The typical BPTEOS composition of a boron-phosphorous $SiO_2$ is boron 4 wt. %, phosphorous 4 wt. %.

The device is then heated to reflow the BPSG layer at a temperature of about 900° C. which reflows the BPSG layer 48, thereby planarizing the BPSG layer 48 with a combined thickness remaining of from about 4700 Å to about 8700 Å.

Subsequently, conventional backend processes follow including process for contact, metallization and passivation.

Before the ROM code masking in FIG. 3G, the oxide spacer can be formed optionally on the nitride side wall to reduce the area of the open window for the ROM code implant. The subsequent thermal cycle can increase the side diffusion of implanted boron such that the ROM cell can be turned off sufficiently to overcome the problem shown in FIG. 2.

Second Embodiment

FIGS. 4A to 4G show a second process flow for an alternative embodiment of this invention which begins following after the process flow steps shown in FIGS. 3A to 3E for forming the device of FIG. 2. Similar elements have similar reference numbers in the drawings.

Figure 4A:
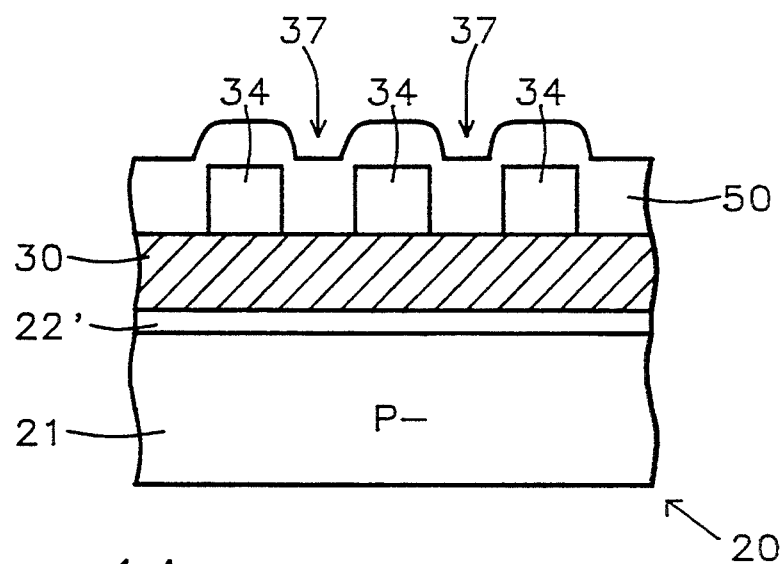
FIGS. 4A to 4G show a second process flow for an alternative embodiment of this invention following after the process flow of FIGS. 3A to 3E for forming the device of FIG. 2.

FIG. 4A shows the first two steps of this alternative process for manufacture of a device in accordance with this invention. First, FIG. 4A shows the device of FIG. 3E after the mask 36 in FIG. 3E has been stripped by a conventional process, leaving the horizontal stripes of silicon nitride layer 34 patterned with horizontal stripes. Secondly, a a conventional silicon dioxide spacer layer 50 is then deposited upon the surface of the device 20.

Figure 4B:
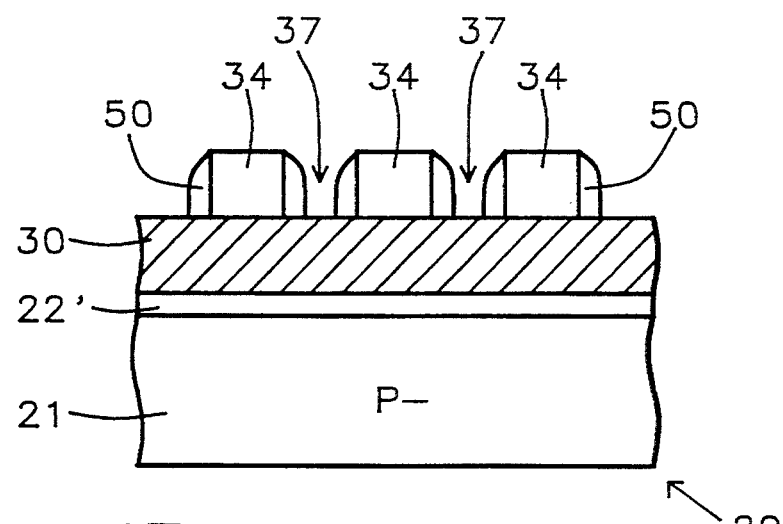

FIG. 4B shows the device of FIG. 4A after the spacer layer 50 has been etched leaving conventional silicon dioxide spacers 50 formed against the side walls of the stripes 34.

Figure 4C:
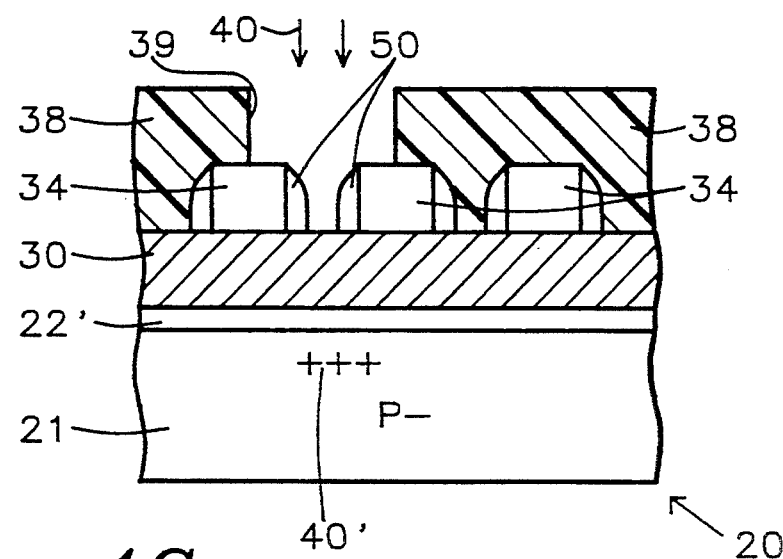

FIG. 4C shows the product of FIG. 4B after a blanket coating of a photoresist layer 38 has been applied to the device 20 shown in FIG. 4B, and a ROM code mask pattern is exposed to the photoresist layer 38 forming a code implant opening 39 therethrough as shown above silicon nitride mask 34 and word line layer 30. In detail, FIG. 4C shows the patterned photoresist layer 38 patterned by conventional photolithographic exposure, followed by development into a mask with the opening 39. The code ion implant of boron B+ ions 40 is performed by passing ions 40 through the opening 39 down through word line layer 30 and gate oxide layer 22' into the P-substrate 21 in a region 40 which is self-aligned with the word line pattern in silicon nitride layer 34. The chemical species of the dopant implanted is boron with a dose of $1 \times 10^{14}/cm^2$ within a range of energy from about 100 keV to about 200 keV.

Figure 4D:
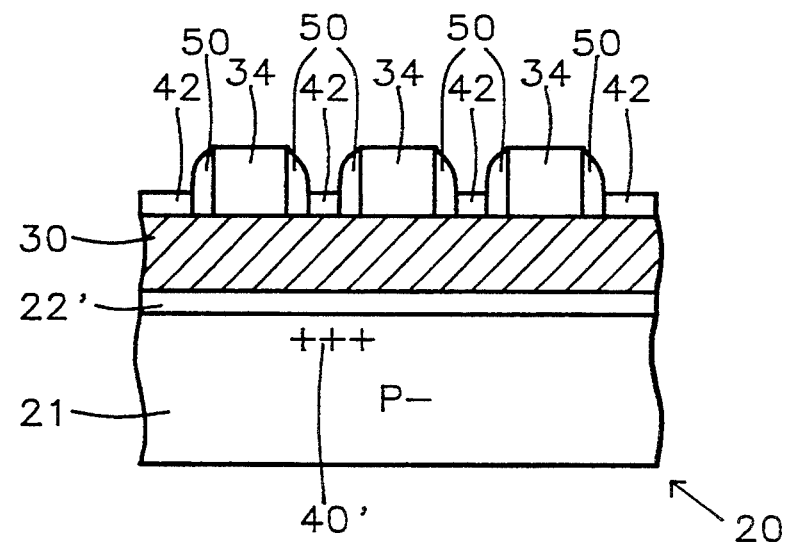

In FIG. 4D, after the ion implantation of code implant region 40, the product of FIG. 4C is shown after the mask 38 has been stripped away by a conventional process, and after a polycrystalline silicon thermal oxide layer 42 having a thickness of about 1000 Å is formed in stripes between the silicon dioxide spacers 50 which are formed against the side walls of the stripes of silicon nitride layer 34. The silicon dioxide layer 42 combined with the silicon dioxide spacers 50 form a positive mask for patterning the word line layer 30 as shown in FIGS. 4E and 4F.

Figure 4E:
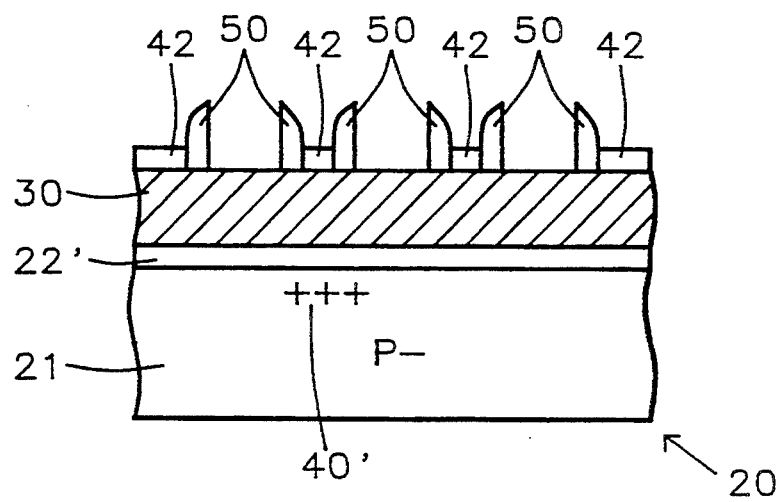
Figure 4F:
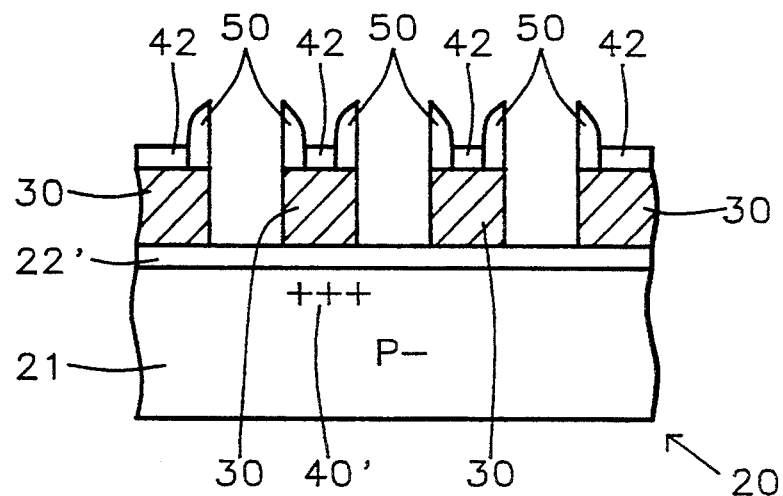
Figure 4G:
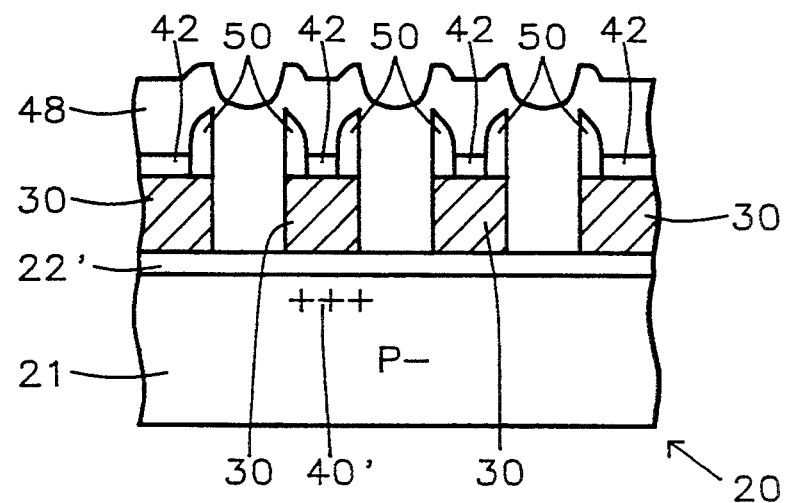

FIG. 4E shows the device of FIG. 4D after the silicon nitride layer 34 has all been stripped away leaving the silicon dioxide layer 42 and the spacer structure 50 in place to form a positive mask for the word line layer 30 as shown in FIGS. 4F and 4G. The $Si_3N_4$ silicon nitride reverse mask 34 is preferably removed by a wet etch.

FIG. 4F shows the device 20 of FIG. 4E, after the word line layer 30 has been etched using silicon dioxide layer 42 plus the silicon dioxide spacers 50 as a mask. As described above layer 30 is preferably composed of polycrystalline silicon containing (polysilicon 2 or polycide 2) with a thickness of about 3,000 Å. Such a polysilicon 2 layer is etched by a conventional etchant.

Next, FIG. 4G shows the device of FIG. 4F after the silicon dioxide "poly oxide" layer 42 and the exposed portions of the surface of gate oxide layer 22' are covered by a blanket dielectric layer 48 preferably composed of glass over the device 20. The glass layer 48 is preferably BPSG which has been formed with a thickness of from about 5,000 Å to about 9,000 Å and with a composition of boron (B) about 4.0% and phosphorous (P) about 4.0%. The process used to deposit the BPSG layer 48 can be performed in an instrument selected from APCVD, PECVD, LPCVD (Low Pressure C.V.D.) which deposits BPSG, BPTEOS, TEOS, etc.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a ROM semiconductor device on a semiconductor substrate with an array of parallel bit lines integral therewith, said bit lines being oriented in a first direction, which comprises the steps of forming a blanket word line layer over said device,
forming a reverse word line mask over said word line layer, said word line mask comprising a parallel array of mask strips,
forming a ROM code mask over said reverse word line mask, said ROM code mask having a ROM code opening therethrough, said opening being centered between a pair of said mask strips,
ion implanting a code implant dopant through said ROM code opening down into a doped region in said substrate below said ROM code opening,
removing said ROM code mask,
forming a word line mask comprising complementary mask strips between said mask strips of said reverse word line mask,
removing said reverse word line mask,
etching said word line layer to form a parallel array of word lines beneath said complementary mask strips, and
forming a blanket layer of dielectric material over said device.

2. The method of claim 1 wherein said reverse word line mask comprises silicon nitride.

3. The method of claim 2 wherein said reverse word line mask has a thickness within the range from about 2,000 Å to about 4,000 Å.

4. The method of claim 1 wherein said word line mask comprises a layer of silicon dioxide having a thickness of about 1,000 Å.

5. The method of claim 1 wherein said word line mask comprises a layer of silicon dioxide formed by thermal oxidation at a temperature of about 850° C. in wet oxygen gas for about 20 minutes.

6. The method of claim 1 wherein, before forming said ROM code mask, forming dielectric spacers on the side-walls of said reverse word line mask over said word line layer whereby the window of the for the ROM code implant is narrowed.

7. The method of claim 6 wherein said reverse word line mask comprises silicon nitride.

8. The method of claim 7 wherein said reverse word line mask has a thickness within the range from about 2,000 Å to about 4,000 Å.

9. The method of claim 8 wherein said word line mask comprises a layer of silicon dioxide having a thickness of about 1,000 Å.

10. The method of claim 8 wherein said word line mask comprises a layer of silicon dioxide formed by thermal oxidation at a temperature of about 850° C. in wet oxygen gas for about 20 minutes.

11. The method of claim 6 wherein said code implant dopant comprises boron implanted with a dose of about $1 \times 10^{14}/cm^2$ within a range of energy levels from about 100 keV to about 200 keV.

12. The method of claim 7 wherein said code implant dopant comprises boron implanted with a dose of about $1 \times 10^{14}/cm^2$ within a range of energy levels from about 100 keV to about 200 keV.

13. The method of claim 8 wherein said code implant dopant comprises boron implanted with a dose of about $1 \times 10^{14}/cm^2$ within a range of energy levels from about 100 keV to about 200 keV.

* * * * *